(12) United States Patent
Osgood et al.

(10) Patent No.: US 11,782,416 B2
(45) Date of Patent: Oct. 10, 2023

(54) COMPENSATION FOR ADDITIVE MANUFACTURING

(71) Applicant: General Electric Company, Schenectady, NY (US)

(72) Inventors: Daniel Endecott Osgood, Loveland, OH (US); Tingfan Pang, West Chester, OH (US); Gregory Terrence Garay, West Chester, OH (US); Xi Yang, Mason, OH (US); Daniel Lee Durstock, Fort Wright, KY (US); Steven Robert Brassfield, North Bend, OH (US); William Charles Herman, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/871,186

(22) Filed: May 11, 2020

(65) Prior Publication Data
US 2021/0349439 A1 Nov. 11, 2021

(51) Int. Cl.
*G05B 19/4099* (2006.01)
*B29C 64/393* (2017.01)
*G06F 30/10* (2020.01)

(52) U.S. Cl.
CPC ........ *G05B 19/4099* (2013.01); *B29C 64/393* (2017.08); *G06F 30/10* (2020.01); *G05B 2219/35036* (2013.01); *G05B 2219/35134* (2013.01); *G05B 2219/49007* (2013.01)

(58) Field of Classification Search
CPC ...... G05B 19/4099; G05B 2219/49007; G05B 2219/35036; G05B 2219/35134; B29C 64/393; G06F 30/10
See application file for complete search history.

(56) References Cited

U.S. PATENT DOCUMENTS

| | | | |
|---|---|---|---|
| 1,934,765 | A | 11/1933 | Julien |
| 3,830,607 | A | 8/1974 | Baxendale et al. |
| 9,511,447 | B2 | 12/2016 | Lin et al. |
| 9,751,610 | B2 | 9/2017 | Hegenbart et al. |
| 10,046,522 | B2 | 8/2018 | Lynch August et al. |
| 10,753,955 | B2 | 8/2020 | Blom et al. |
| 10,807,154 | B2 | 10/2020 | Garay et al. |
| 10,996,652 | B2 | 5/2021 | Chin et al. |
| 11,073,824 | B1* | 7/2021 | Chapman ......... G05B 19/41875 |

(Continued)

FOREIGN PATENT DOCUMENTS

| | | |
|---|---|---|
| CA | 2643658 A1 | 5/2009 |
| CA | 2883188 A1 | 8/2015 |

(Continued)

OTHER PUBLICATIONS

IT201800010201A1, US2018/194630.

*Primary Examiner* — Christopher E. Everett
*Assistant Examiner* — Yvonne Trang Follansbee
(74) *Attorney, Agent, or Firm* — McGarry Bair PC

(57) ABSTRACT

A method of using additive manufacturing to form or print a component based on an original model of a component, where the geometry of the original model is compensated to form a compensated model. The compensated model can be used to form or print the component. The printed component as a final model can then be compared to the original model.

19 Claims, 9 Drawing Sheets

(56) References Cited

U.S. PATENT DOCUMENTS

| | | | |
|---|---|---|---|
| 11,138,352 B2 | 10/2021 | Chen et al. | |
| 2005/0081813 A1* | 4/2005 | Irie | F02M 35/10347 123/193.5 |
| 2006/0003095 A1 | 1/2006 | Bullen et al. | |
| 2014/0107823 A1* | 4/2014 | Huang | B29C 64/112 700/98 |
| 2015/0145169 A1 | 5/2015 | Liu et al. | |
| 2016/0102781 A1 | 4/2016 | Glaun | |
| 2016/0320771 A1 | 11/2016 | Huang | |
| 2017/0368753 A1 | 12/2017 | Yang et al. | |
| 2018/0009128 A1 | 1/2018 | Sokol et al. | |
| 2018/0095450 A1 | 4/2018 | Appas et al. | |
| 2018/0161858 A1* | 6/2018 | Garay | B29C 64/135 |
| 2018/0236725 A1 | 8/2018 | Susnjara et al. | |
| 2019/0004079 A1* | 1/2019 | Blom | G01N 35/1011 |
| 2019/0184643 A1 | 6/2019 | Schneider et al. | |
| 2019/0377843 A1* | 12/2019 | Chen | G06T 17/20 |
| 2020/0004225 A1 | 1/2020 | Buller et al. | |
| 2020/0074028 A1 | 3/2020 | Yang et al. | |
| 2021/0252596 A1 | 8/2021 | Sale et al. | |

FOREIGN PATENT DOCUMENTS

| | | |
|---|---|---|
| CN | 109203479 A | 1/2019 |
| CN | 110087797 A | 8/2019 |
| CN | 110570512 A | 12/2019 |
| DE | 2363652 A1 | 7/1974 |
| EP | 1136235 A1 | 9/2001 |
| EP | 34541222 A1 | 2/2019 |
| EP | 3579199 A1 | 12/2019 |
| IT | 201800010201 A1 | 5/2020 |
| TW | 201945099 A | 12/2019 |
| WO | 2015167965 A1 | 11/2015 |
| WO | 2018/194630 A1 | 10/2018 |
| WO | 2018/195499 A1 | 10/2018 |
| WO | 2019112661 A1 | 6/2019 |

\* cited by examiner

COMPENSATION FOR ADDITIVE MANUFACTURING

TECHNICAL FIELD

This disclosure relates to a method of forming or printing a model using additive manufacturing, and more specifically, using additive manufacturing with geometric compensation.

BACKGROUND

Additive manufacturing processes generally involve the buildup of one or more materials to make an object, in contrast to subtractive manufacturing methods, which remove material. Additive manufacturing can be utilized to form a variety of components having both simple and intricate geometries.

BRIEF DESCRIPTION

In one aspect, the present disclosure relates to a method of forming a component, the method including providing an original model of the component, compensating a geometry of the original model to create a compensated model, and forming the component based upon the compensated model such that a final model of the component is more alike the original model than the compensated model due to distortions during forming of the component.

In another aspect, the present disclosure relates to a method of printing a component that includes receiving an original model of the component at a printer, compensating the geometry of the original model at the printer to create a compensated model, printing, with the printer, the component based upon the compensated model such that the printed component is more alike the original model than the compensated model due to distortions of the printer during printing.

In yet another aspect, the present disclosure relates to a system for forming a component, the system including a source storing or generating an original model of the component, a printer, in communication with the source, for printing the component based upon the original model received from the source, wherein the source or the printer includes compensating software where the compensating software analyzes the original model and compensates the original model to become a compensated model such that printing of the component based upon the compensated model is more alike the original model than the compensated model.

DETAILED DESCRIPTION

Figure 1:
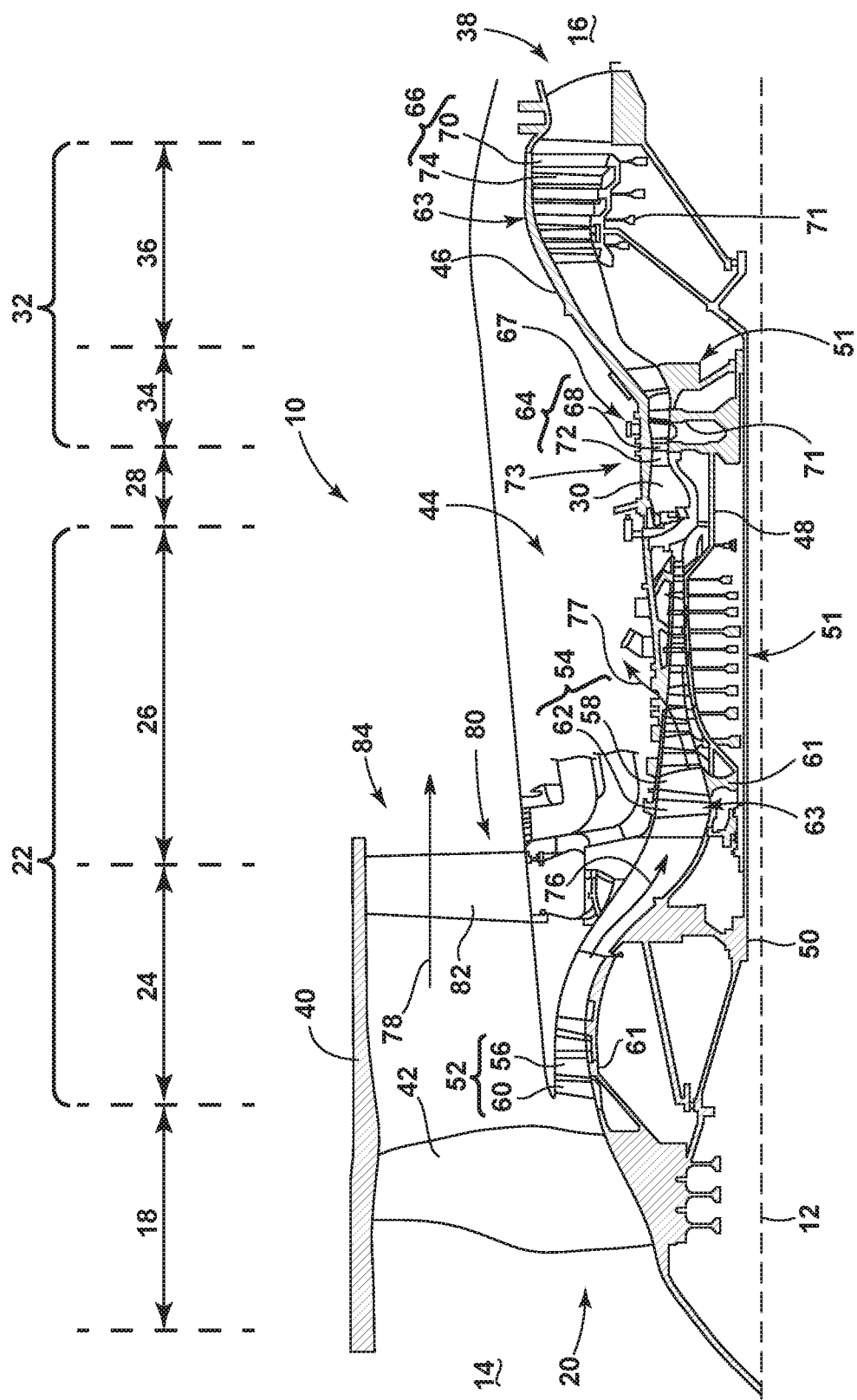
FIG. 1 is a schematic, sectional view of a turbine engine.

Aspects of the present disclosure are described herein in the exemplary context of a turbine engine, which utilizes additive manufacturing to produce molds, components, parts, models, or other aspects of the components of the turbine engine. However, it will be understood that the disclosure is not so limited and has general applicability to environments requiring additive manufacturing, such as those in non-aircraft applications, including other mobile applications and non-mobile industrial, commercial, and residential applications, or any other locale, area, or other environment where additive manufacturing is desirable.

As used herein, the term "additive manufacturing" generally refers to manufacturing processes wherein successive layers of material(s) are provided on each other to "build-up," layer-by-layer, a three-dimensional component. The successive layers generally fuse together to form a monolithic unitary component, which can have a variety of integral sub-components. Monolithic, as used herein, refers to a unitary structure lacking interfaces or joints by virtue of the materials of each layer fusing to or melting with the materials of adjacent layers such that the individual layers lose their identity in the final unitary structure.

Suitable additive manufacturing techniques in accordance with the present disclosure include, for example, Directed Energy Deposition (DED), Fused Deposition Modeling (FDM), Selective Laser Sintering (SLS), 3D printing such as by inkjets and laserjets, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM), Direct Metal Laser Melting (DMLM), and other known processes.

In addition to using a direct metal laser sintering (DMLS) or direct metal laser melting (DMLM) process where an energy source is used to selectively sinter or melt portions of a layer of powder, it should be appreciated that according to alternative aspects of the present disclosure, the additive manufacturing process can be a "binder jetting" process. In this regard, binder jetting involves successively depositing layers of additive powder in a similar manner as described above. However, instead of using an energy source to generate an energy beam to selectively melt or fuse the additive powders, binder jetting involves selectively depositing a liquid binding agent onto each layer of powder. The liquid binding agent can be, for example, a photo-curable polymer or another liquid bonding agent. Other suitable additive manufacturing methods and variants are intended to be within the scope of the present subject matter.

In addition, one skilled in the art will appreciate that a variety of materials and methods for bonding those materials can be used and are contemplated as within the scope of the present disclosure. As used herein, references to "fusing" can refer to any suitable process for creating a bonded layer of any of the above materials. For example, if an object is made from polymer, fusing can refer to creating a thermoset bond between polymer materials. If the object is epoxy, the bond can be formed by a crosslinking process. If the material is ceramic, the bond can be formed by a sintering process. If the material is powdered metal, the bond can be formed by a melting or sintering process. One skilled in the art will appreciate that other methods of fusing materials to make a component by additive manufacturing are possible, and the presently disclosed subject matter can be practiced with those methods.

In addition, the additive manufacturing process disclosed herein allows a single component to be formed from multiple materials. Thus, the components described herein can be formed from any suitable mixtures of the above materials. For example, a component can include multiple layers, segments, or parts that are formed using different materials, processes, or on different additive manufacturing machines. In this manner, components can be constructed which have different materials and material properties for meeting the demands of any particular application. In addition, although the components described herein are constructed entirely by additive manufacturing processes, it should be appreciated that in additional aspects of the present disclosure, all or a portion of these components can be formed via casting, machining, or any other suitable manufacturing process. Indeed, any suitable combination of materials and manufacturing methods can be used to form these components.

An exemplary additive manufacturing process will now be described. Additive manufacturing processes fabricate components using three-dimensional (3D) information, for example a three-dimensional computer model, of the component. Accordingly, a three-dimensional design model of the component can be defined prior to manufacturing. In this regard, a model or prototype of the component can be scanned to determine the three-dimensional information of the component. As another example, a model of the component can be constructed using a suitable computer aided design (CAD) program to define the three-dimensional design model of the component.

The design model can include 3D numeric coordinates of the entire configuration of the component including both external and internal surfaces of the component. For example, the design model can define the body, the surface, and/or internal passageways such as passageways, voids, support structures, etc. In one exemplary non-limiting example, the three-dimensional design model is converted into a plurality of slices or segments, e.g., along a central (e.g., vertical) axis of the component or any other suitable axis. Each slice can define a thin cross section of the component for a predetermined height of the slice. The plurality of successive cross-sectional slices together form the 3D component. The component is then "built-up" slice-by-slice, or layer-by-layer, until finished.

In this manner, the components described herein can be fabricated using the additive process, or more specifically each layer is successively formed, e.g., by fusing or polymerizing a plastic using laser energy or heat or by sintering or melting metal powder. For example, a particular type of additive manufacturing process can use an energy beam, for example, an electron beam or electromagnetic radiation such as a laser beam, to sinter or melt a powder material. Any suitable laser and laser parameters can be used, including considerations with respect to power, laser beam spot size, and scanning velocity. The build material can be formed by any suitable powder or material selected for enhanced strength, durability, and useful life, particularly at high temperatures.

Each successive layer can be, for example, between about 10 µm and 200 µm, although the thickness can be selected based on any number of parameters and can be any suitable size according to alternative aspects of the present disclosure. Therefore, utilizing the additive formation methods described above, the components described herein can have cross sections as thin as one thickness of an associated powder layer, e.g., 10 µm, utilized during the additive formation process.

In addition, utilizing an additive process, the surface finish and features of the components can vary as need depending on the application. For example, the surface finish can be adjusted (e.g., made smoother or rougher) by selecting appropriate laser scan parameters (e.g., laser power, scan speed, laser focal spot size, etc.) during the additive process, especially in the periphery of a cross-sectional layer, which corresponds to the part surface. For example, a rougher finish can be achieved by increasing laser scan speed or decreasing the size of the melt pool formed, and a smoother finish can be achieved by decreasing laser scan speed or increasing the size of the melt pool formed. The scanning pattern or laser power can also be changed to change the surface finish in a selected area.

Notably, in exemplary non-limiting examples, several features of the components described herein were previously not possible due to manufacturing restraints. However, the present inventors have advantageously utilized current advances in additive manufacturing techniques to develop such components generally in accordance with the present disclosure. While the present disclosure is not limited to the use of additive manufacturing to form these components generally, additive manufacturing does provide a variety of manufacturing advantages, including ease of manufacturing, reduced cost, greater accuracy, etc.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward can mean upstream and aft/rearward can mean downstream.

Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to affect a functional or operable outcome, as described herein.

Additionally, as used herein, elements being "electrically connected," "electrically coupled," "communicatively coupled" or "in electrical communication", as well as terminology similar thereto, can include an electric, wired or wireless, transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an example, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 is a schematic cross-sectional diagram of a turbine engine 10 for an aircraft. The turbine engine 10 has a centerline or longitudinal axis 12 extending forward 14 to aft 16. The turbine engine 10 includes, in downstream serial flow relationship, a fan section 18 including a fan 20, a compressor section 22 including a booster or low pressure (LP) compressor 24 and a high pressure (HP) compressor 26, a combustion section 28 including a combustor 30, a turbine section 32 including a HP turbine 34, and a LP turbine 36, and an exhaust section 38.

The fan section 18 includes a fan casing 40 surrounding the fan 20. The fan 20 includes a plurality of fan blades 42 disposed radially about the longitudinal axis 12. The HP compressor 26, the combustor 30, and the HP turbine 34 form an engine core 44, which generates combustion gases. The engine core 44 is surrounded by core casing 46, which can be coupled with the fan casing 40.

A HP shaft or spool 48 disposed coaxially about the longitudinal axis 12 of the turbine engine 10 drivingly connects the HP turbine 34 to the HP compressor 26. A LP shaft or spool 50, which is disposed coaxially about the longitudinal axis 12 of the turbine engine 10 within the larger diameter annular HP spool 48, drivingly connects the LP turbine 36 to the LP compressor 24 and fan 20. The spools 48, 50 are rotatable about the engine centerline and couple to a plurality of rotatable elements, which can collectively define an inner rotor/stator 51. While illustrated as a rotor, it is contemplated that the inner rotor/stator 51 can be a stator.

The LP compressor 24 and the HP compressor 26 respectively include a plurality of compressor stages 52, 54, in which a set of compressor blades 56, 58 rotate relative to a corresponding set of static compressor vanes 60, 62 (also called a nozzle) to compress or pressurize the stream of fluid passing through the stage. In a single compressor stage 52, 54, multiple compressor blades 56, 58 can be provided in a ring and can extend radially outwardly relative to the longitudinal axis 12, from a blade platform to a blade tip, while the corresponding static compressor vanes 60, 62 are positioned upstream of and adjacent to the rotating compressor blades 56, 58. It is noted that the number of blades, vanes, and compressor stages shown in FIG. 1 were selected for illustrative purposes only, and that other numbers are possible.

The compressor blades 56, 58 for a stage of the compressor can be mounted to a disk 61, which is mounted to the corresponding one of the HP and LP spools 48, 50, with each stage having its own disk 61. The vanes 60, 62 for a stage of the compressor can be mounted to the core casing 46 in a circumferential arrangement.

The HP turbine 34 and the LP turbine 36 respectively include a plurality of turbine stages 64, 66, in which a set of turbine blades 68, 70 are rotated relative to a corresponding set of static turbine vanes 72, 74 (also called a nozzle) to extract energy from the stream of fluid passing through the stage. In a single turbine stage 64, 66, multiple turbine blades 68, 70 can be provided in a ring and can extend radially outwardly relative to the longitudinal axis 12, from a blade platform to a blade tip, while the corresponding static turbine vanes 72, 74 are positioned upstream of and adjacent to the rotating blades 68, 70. It is noted that the number of blades, vanes, and turbine stages shown in FIG. 1 were selected for illustrative purposes only, and that other numbers are possible.

The blades 68, 70 for a stage of the turbine can be mounted to a disk 71, which is mounted to the corresponding one of the HP and LP spools 48, 50, with each stage having a dedicated disk 71. The vanes 72, 74 for a stage of the compressor can be mounted to the core casing 46 in a circumferential arrangement.

Complementary to the rotor portion, the stationary portions of the turbine engine 10, such as the static vanes 60, 62, 72, 74 among the compressor and turbine section 22, 32 are also referred to individually or collectively as an outer rotor/stator 63. As illustrated, the outer rotor/stator 63 can refer to the combination of non-rotating elements throughout the turbine engine 10. Alternatively, the outer rotor/stator 63 that circumscribes at least a portion of the inner rotor/stator 51, can be designed to rotate. The inner or outer rotor/stator 51, 63 can include at least one component that can be, by way of non-limiting example, a shroud, vane, nozzle, nozzle body, combustor, hanger, or blade, where the at least one component is a plurality of circumferentially arranged component segments having confronting pairs of circumferential ends.

In operation, the airflow exiting the fan section 18 is split such that a portion of the airflow is channeled into the LP compressor 24, which then supplies pressurized airflow 76 to the HP compressor 26, which further pressurizes the air. The pressurized airflow 76 from the HP compressor 26 is mixed with fuel in the combustor 30 and ignited, thereby generating combustion gases. Some work is extracted from these gases by the HP turbine 34, which drives the HP compressor 26. The combustion gases are discharged into the LP turbine 36, which extracts additional work to drive the LP compressor 24, and the exhaust gas is ultimately discharged from the turbine engine 10 via the exhaust section 38. The driving of the LP turbine 36 drives the LP spool 50 to rotate the fan 20 and the LP compressor 24.

A portion of the pressurized airflow 76 can be drawn from the compressor section 22 as bleed air 77. The bleed air 77 can be drawn from the pressurized airflow 76 and provided to engine components requiring cooling. The temperature of pressurized airflow 76 entering the combustor 30 is significantly increased. As such, cooling provided by the bleed air 77 is necessary for operating such engine components in the heightened temperature environments.

A remaining portion of the airflow 78 bypasses the LP compressor 24 and the engine core 44 and exits the turbine engine 10 through a stationary vane row, and more particularly an outlet guide vane assembly 80, comprising a plurality of airfoil guide vanes 82, at the fan exhaust side 84. More specifically, a circumferential row of radially extending airfoil guide vanes 82 are utilized adjacent the fan section 18 to exert some directional control of the airflow 78.

Some of the air supplied by the fan 20 can bypass the engine core 44 and be used for cooling of portions, especially hot portions, of the turbine engine 10, and/or used to cool or power other aspects of the aircraft. In the context of a turbine engine, the hot portions of the engine are normally downstream of the combustor 30, especially the turbine section 32, with the HP turbine 34 being the hottest portion as it is directly downstream of the combustion section 28. Other sources of cooling fluid can be, but are not limited to, fluid discharged from the LP compressor 24 or the HP compressor 26.

Figure 2:
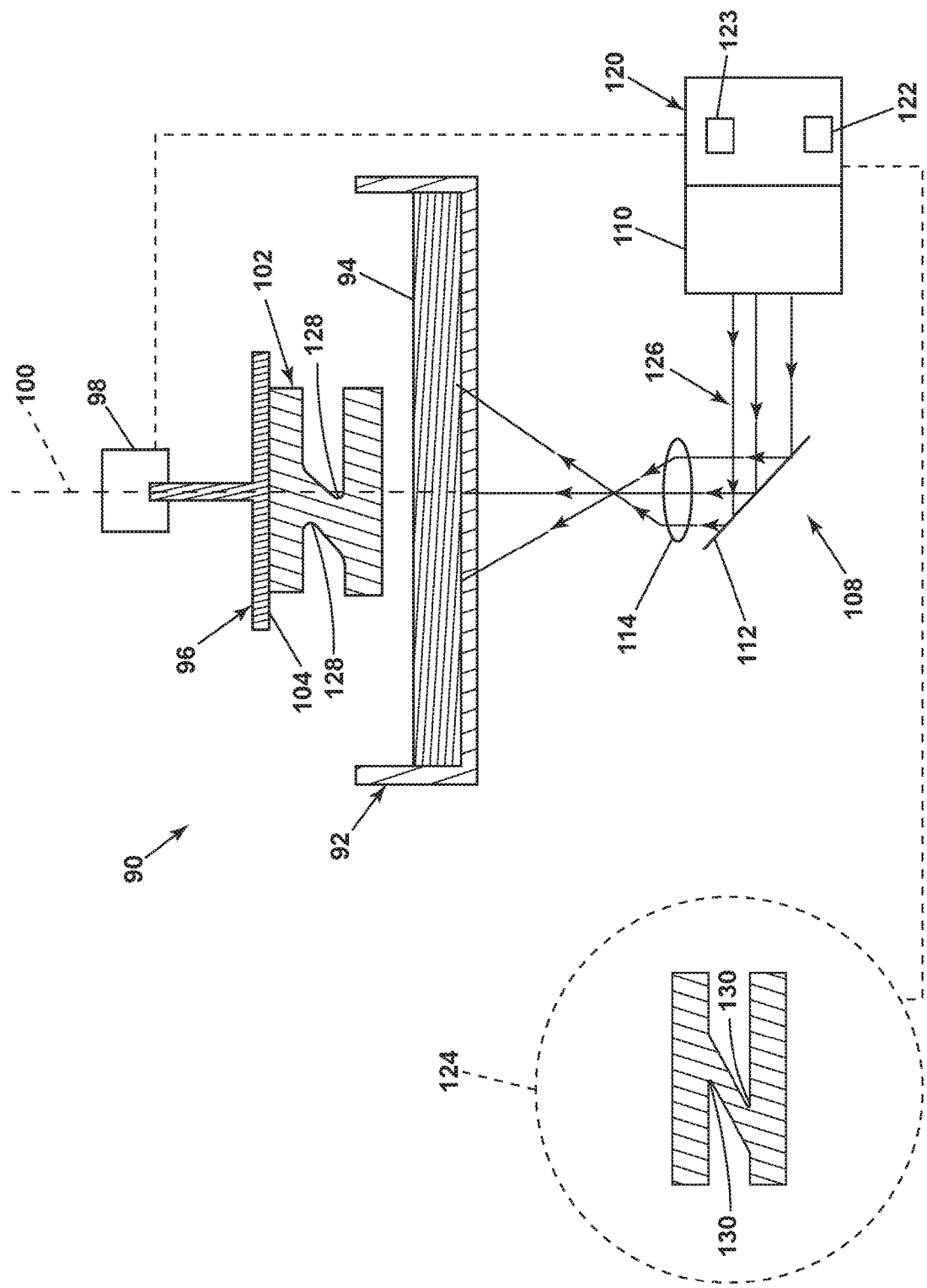
FIG. 2 is a schematic view of a final model of a component for the turbine engine of FIG. 1 formed by a Digital Light Processing (DLP) printer.

FIG. 2 is a schematic illustrating of an additive manufacturing device for producing a portion of or component for the turbine engine of FIG. 1. While the additive manufacturing as described herein is discussed in relation to a turbine engine, component therefore, or portion thereof, it should be appreciated that the parts, components, or elements printed by the additive manufacturing device can be for any implementation or application, such as those outside of a turbine engine, including but not limited to residential, non-residential, commercial, industrial, or any other application. The additive manufacturing device is illustrated, by way of non-limiting example, as a digital light processing (DLP) 3D printer 90. The DLP 3D printer 90 can include a transparent vat or transparent tank 92 containing, for example, a photopolymer resin 94. A building platform 96 couples to a motor 98 permitting movement in the direction of at least the Z-axis 100, such as for raising or lowering the building platform 96 from or toward the resin 94. A printed part, component, or final model 102 couples to a lower portion 104 of the building platform 96.

A lighting assembly 108 is located, at least in part, below the tank 92. The lighting assembly 108 can include a light source 110, a deflection mirror 112, and at least one lens 114. A controller 120 can couple to or be in communication with the light source 110 and the motor 98. The controller 120 can include a memory 122 for programming software or operational software, as well as a processor 123 for performing tasks or running the software, for example.

In operation, an original model 124 is loaded into the controller 120 or recalled from the memory 122. The original model 124 can be stored or virtually created as a virtual model. The term "virtual model" as used herein relates to a digital representation of a physical object and serves as a basis for simulating the fabrication process of the object. The virtual model can also be used to prototype the object.

The controller 120 processes the original model 124 into a plurality of layers. The layers can be arranged into reverse layers in the Z-axis direction, such that the component is built from the bottom up. The controller 120 then moves the building platform 96 into the photopolymer resin 94, until a predetermined distance between the lower portion 104 and a base of the tank 92 is achieved.

The controller 120 activates the light source 110. The light, illustrated as rays 126, can be a beam of light that is guided to the tank 92 via the deflection mirror 112 and the lens 114. The controller 120 can adjust the light source 110, the number of rays 126, the intensity of the rays 126, the deflection mirror 112, or the lens 114 so that a layer of resin based on the first required layer of the original model 124 is cured by the light rays 126 and affixed to the lower portion 104 of the building platform 96. The layer of resin can include inconsistencies from the first required layer of the original model 124 due to distortions during printing.

The controller 120 then raises the building platform 96 a predetermined distance, which can be the width of one build layer, for example. Again, the light source 110, the deflection mirror 112, or the lens 114 are adjusted so that a layer of resin based on the second required layer of the original model 124 is cured to the first required layer on the lower portion 104 of the building platform 96.

This process repeats until the final model 102 is complete. The final model 102 often does not include all the detail or features of the original model 124 due to distortions during forming. By way of non-limiting example, the final model 102 can include curved portions 128, which often occur when sharp acute angles 130 are included in the geometry of the original model 124. In FIG. 2, such a distortion is identifiable, as the acute angles 130 in the original model 124 are printed as the curved portions 128 in the final model 102.

Figure 3A:
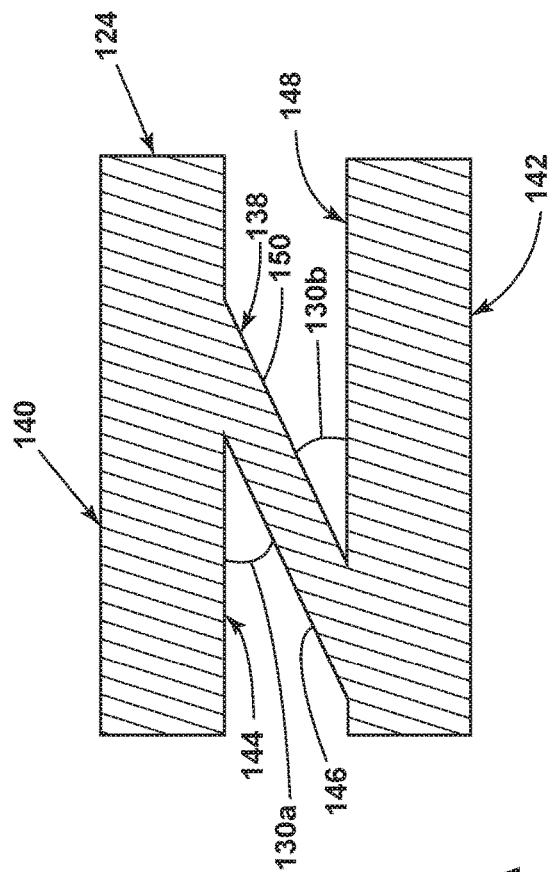
FIG. 3A schematically illustrates the final model of the component of FIG. 2.
Figure 3B:
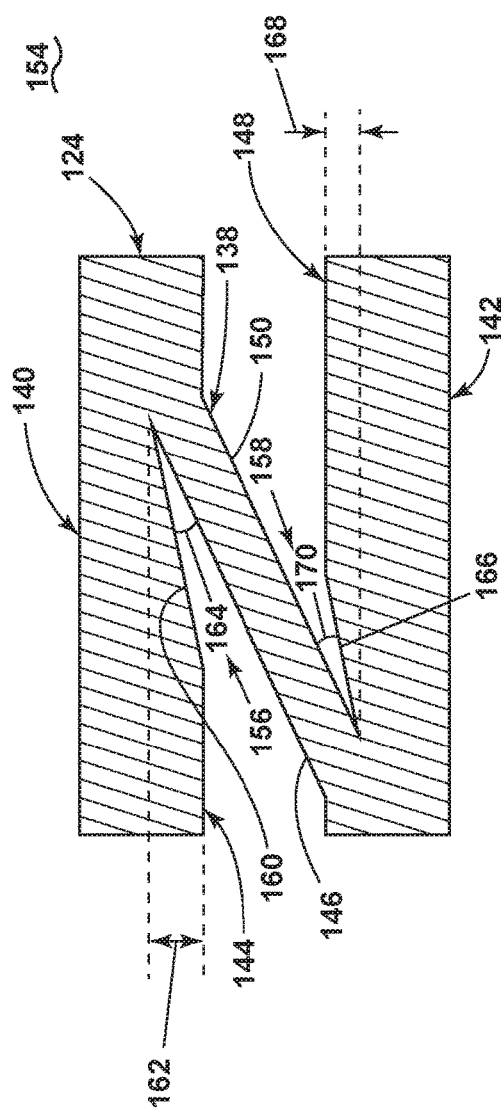
FIG. 3B schematically illustrates a compensation model for the final model of FIG. 3A.
Figure 3C:
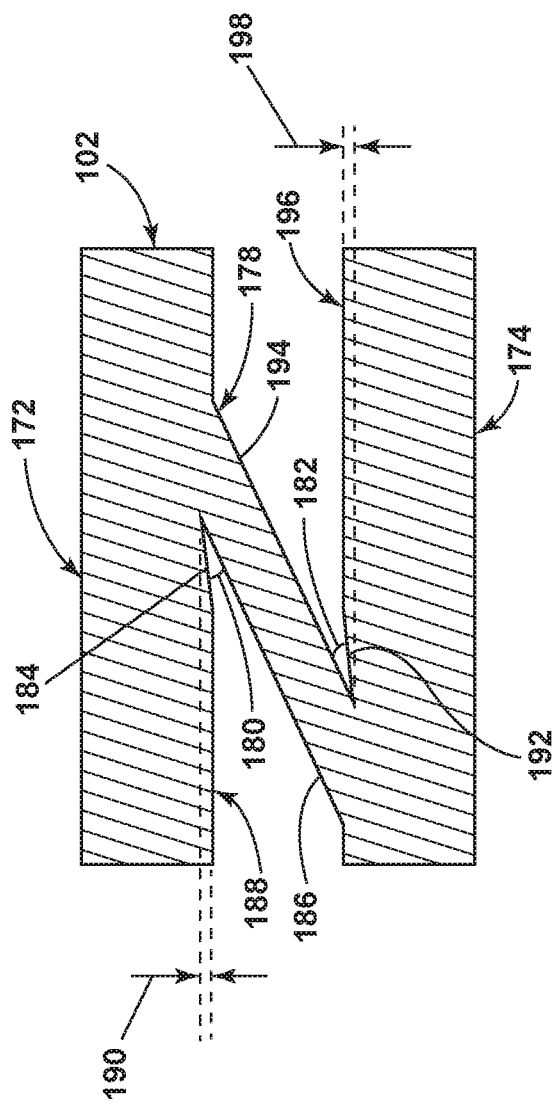
FIG. 3C schematically illustrates a printed final model based upon the final model of FIG. 3A as compensated to be the compensation model of FIG. 3B.

FIGS. 3A-3C illustrate, by way of non-limiting example, a compensation for the original model, such as an electronic compensation that results in the final model 102 more closely matching the dimensions, shape, and angles of the original model 124, minimizing, reducing, or eliminating the distortions resultant of the printing or forming technique.

FIG. 3A illustrates a cross sectional view of the original model 124 with first and second walls 140, 142 coupled by a ligament 138. The intersection of the ligament 138 with the first and/or second walls 140, 142 can define first and/or second acute angles 130*a*, 130*b*. It should be appreciated that the models described herein, such as the original model 124, can be virtual or computer-generated models, such as formed on a computer, a computer program or other software, or any other medium or platform that does not require a physical embodiment of the model, while a physical manifestation is contemplated.

The first acute angle 130*a* can be measured from a first inner platform 144 of the first wall 140 to a first outside edge 146 of the ligament 138 adjacent the first inner platform 144. The second acute angle 130*b* can be measured from a second inner platform 148 of the second wall 142 to a second outside edge 150 of the ligament 138 adjacent the second inner platform 148. The first and second acute angles 130*a*, 130*b* can be any acute angle or right angle between and including 0 degrees to 90 degrees. While illustrated as having relatively the same measurement, it is contemplated that the first acute angle 130*a* can be greater than, less than, or equal to the second acute angle 130*b*. It is further contemplated that the first wall 140, the second wall 142, or ligament can have any shape, contour, or orientation. The inset distance of the first or second acute angle 130*a*, 130*b* is essentially zero, as the angle is measured from the first or second inner platforms 144, 148 that do not include inset walls or portions. The term "inset distance" can be the maximum distance a negative print region extends into a wall, as measured from the inner platform.

FIG. 3B illustrates a cross sectional view of a compensated model 154 that can be a virtual or computer-generated model, in one non-limiting example, similar to that of the original model 124 of FIG. 3A. The compensated model 154 can be defined as the original model 124 including at least one compensation. The at least one compensation can be a negative print region, where the shape of the negative print region includes intentional and predetermined geometries. As illustrated, by way of non-limiting example, the compensation can be first and second negative print regions 156, 158 in the shape of triangles, while any suitable geometry is contemplated. As used herein, the term "negative print region" relates to a region where material is removed from the original model. That is, regions of the original model 124 denoted as printable material that are intentionally not included to be printable material in the compensated model 154. The first and second negative print regions 156, 158 remove portions of the first and second walls 140, 142 that partially form the first and second acute angles 130*a*, 130*b*.

The first negative print region 156 can, at least in part, be defined by a first set of inset walls 160 that are portions of the first inner platform 144 that extend into the first wall 140 a maximum of a first inset distance 162. A first acute angle 164 can be defined by at least one of the first set of inset walls 160 adjacent the first outside edge 146 of the ligament 138.

The second negative print region 158 can, at least in part, be defined by a second set of inset walls 166 that are portions of the second inner platform 148 that extend into the second wall 142 a maximum of a second inset distance 168. A second acute angle 170 can be defined by at least one of the second set of inset walls 166 adjacent the second outside edge 150 of the ligament 138.

FIG. 3C illustrates a cross sectional view of the final model 102 printed by an additive manufacturing device based on the compensation model 154. The final model 102 includes first and second printed walls 172, 174 coupled by a printed ligament 178. The intersection of the printed ligament 178 and the first and second printed walls 172, 174 can define first and second acute angles 180, 182.

The first acute angle 180 can be defined as the angle between at least one of a first set of inset walls 184 and a first outside edge 186 of the printed ligament 178 adjacent to the at least one of the first set of inset walls 184. The first set of inset walls 184 are portions of a first inner platform 188 that extend into the first printed wall 172 to a first inset distance 190.

The second acute angle 182 can be defined as the angle between at least one of a second set of inset walls 192 and a second outside edge 194 of the printed ligament 178 adjacent to the at least one of the second set of inset walls 192. The second set of inset walls 192 are portions of a second inner platform 196 that extend into the second printed wall 172 to a second inset distance 198.

In operation, FIG. 3A illustrates the desired component to be printed as the original model 124. The compensated model 154 uses the original model 124 and compensates for distortions during the forming of the component. The compensation for distortions can include the input of the original model into one or more software programs for analysis. The analysis can include the detection or identification of geometries likely to result in distortions. The compensated model 154 results from predetermined compensations based on the geometries likely to result in distortions in order to minimize distortions.

The compensation illustrated in FIG. 3B is an example of compensation for sharp acute angles that, when printed, can result in curved portions 128 (FIG. 2). The compensation can include the first and second negative print regions 156, 158, modifying the original model 124, so that when the compensation model 154 is used to form the component, the result, as shown in FIG. 3C, is that the final model 102 of the component is more alike the original model than the compensated model 154, or more alike the original model than a printed version without compensation, or both. More specifically, the determination of "more alike" can be the comparison of dimension values of similar aspects of the original model 124, the compensated model 154, and the final model 102. By way of non-limiting example, the final model 102 is more alike the original model 124 when the first acute angle 180 of the final model 102 is closer in value to the first acute angle 130*a* of the original model 124 than the value of the first acute angle 164 of the compensated model 154. Another non-limiting illustration of the final model 102 being more alike the original model 124 than the compensated model 154 is when the second acute angle 182 of the final model 102 is closer in value to the second acute angle 130*b* of the original model 124 than the value of the first acute angle 170 of the compensated model 154. Yet another non-limiting illustration of the final model 102 being more alike the original model 124 than the compensated model 154 is when the first or second inset distance 190, 198 of the final model 102 is closer in value to the first or second inset distance of the original model 124, illustrated as zero, than the value of the first or second inset distance 162, 168 of the compensated model 154.

Figure 4A:
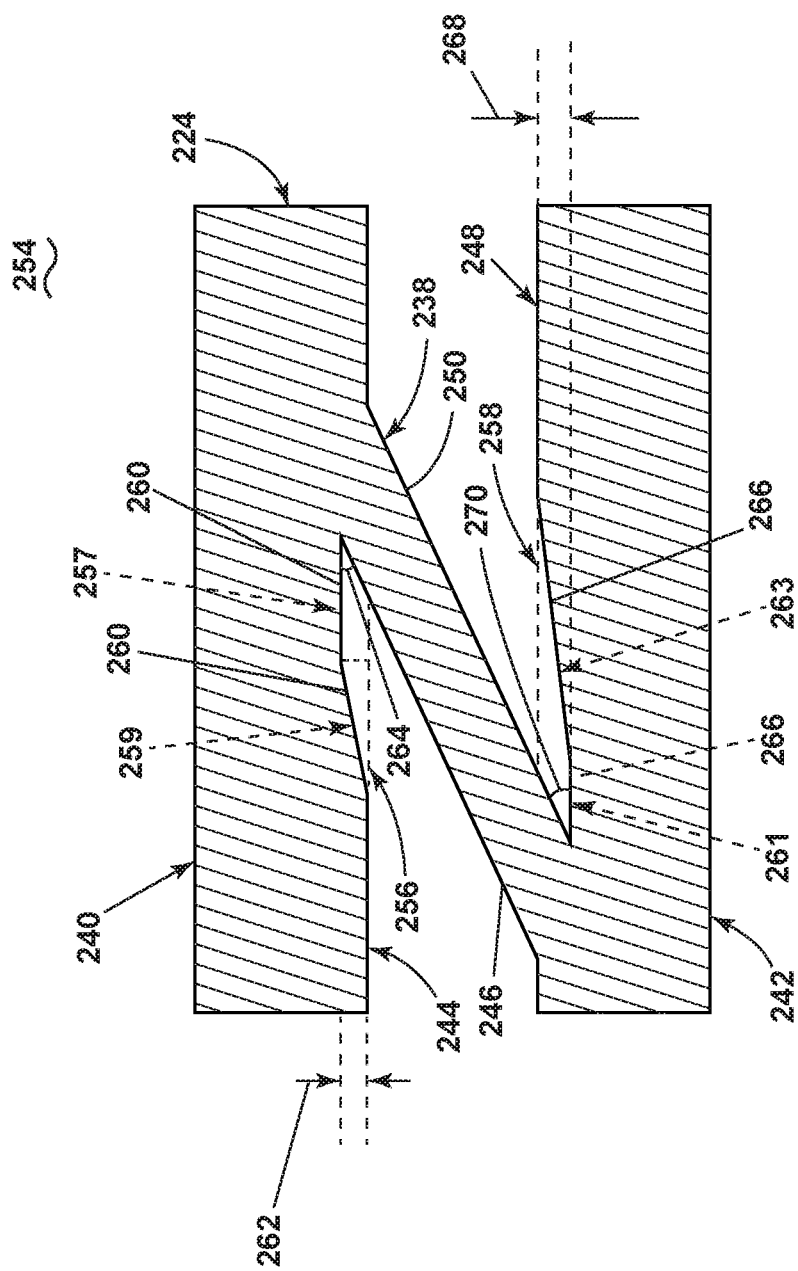
FIG. 4A schematically illustrates an exemplary variation in generating a compensation model.

FIG. 4A is another example of a compensated model 254 that can be used in manufacturing components of the turbine engine 10 or other additively manufactured components. The compensated model 254 of FIG. 4A is similar to compensated model 154 of FIG. 3B, therefore, like parts will be identified with like numerals increased by 100, with it being understood that the description of the like parts of the compensated model 154 applies to the compensated model 254, unless otherwise noted.

The compensated model 254 includes an original model 224 and at least one compensation. As illustrated, by way of non-limiting example, the compensation can be a first negative print region 256 having a shape that combines a quadrilateral 257 and a triangle 259. Further, for example, the second negative print region 258 can have a shape that combines a first and second triangle 261, 263. That is, a portion of first and second walls 240, 242 originally intended to be printed are removed to form the compensation model 254. The portion of first and second walls 240, 242 that is removed partially form first and second compensation angles 264, 270.

The first negative print region 256 can, at least in part, be defined by a first set of inset walls 260 that are portions of a first inner platform 244. The first set of inset walls 260 can extend into the first wall 240 a maximum of a first inset distance 262. The first compensation angle 264 can be defined by at least one of the first set of inset walls 260 adjacent a first outside edge 246 of a ligament 238.

The second negative print region 258 can, at least in part, be defined by a second set of inset walls 266 that are portions of a second inner platform 248. The second set of inset walls 266 can extend into the second wall 242 a maximum of a second inset distance 268. A second compensation angle 270 can be defined by at least one of the second set of inset walls 266 adjacent a second outside edge 250 of the ligament 238.

Figure 4B:
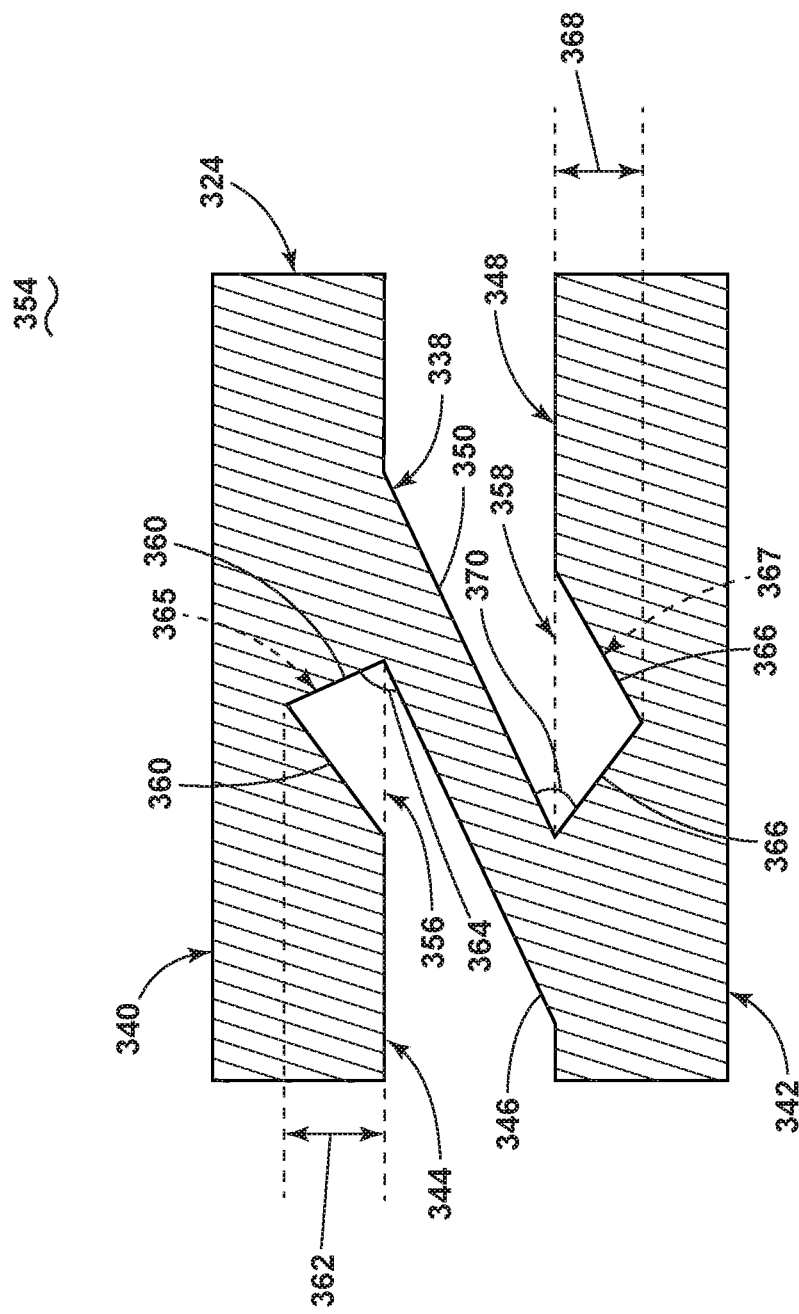
FIG. 4B schematically illustrates another exemplary variation in generating a compensation model.

FIG. 4B is yet another example of a compensated model 354 that can be used in manufacturing components of the turbine engine 10. The compensated model 354 of FIG. 4B is similar to compensated model 154 of FIG. 3B, and therefore, like parts will be identified with like numerals increased by 200, with it being understood that the description of the like parts of the compensated model 154 applies to the compensated model 354, unless otherwise noted.

The compensated model 354 includes an original model 324 and at least one compensation. As illustrated, by way of non-limiting example, the compensation can be a first and second negative print region 356, 358 in the shape of triangles 365, 367. The first and second negative print region 356, 358 remove a portion of first and second walls 340, 342 that partially form first and second angles 364, 370.

The first negative print region 356 can, at least in part, be defined by a first set of inset walls 360 that are portions of a first inner platform 344. The first set of inset walls 360 can extend into the first wall 340 a maximum of a first inset distance 362. The first angle 364 can be defined by at least one of the first set of inset walls 360 adjacent a first outside edge 346 of a ligament 338.

The second negative print region 358 can, at least in part, be defined by a second set of inset walls 366 that are portions of a second inner platform 348. The second set of inset walls 366 can extend into the second wall 342 a maximum of a second inset distance 368. The second angle 370 can be defined by at least one of the second set of inset walls 366 adjacent a second outside edge 350 of the ligament 338.

FIGS. 4A-4B are non-limiting examples of compensation models. Compensation models can include any number of negative print regions when compared to the original model. It is contemplated that the negative print regions can actually be positive print regions where material is added to the print design of the compensated model when compared to the original model. Compensations illustrated herein are illustrated by way of cross-section. It is contemplated that compensations can be three dimensional (3D). That is, when the cross section of the component is taken, it can vary, compensating for geometries three dimensionally. For example, the three-dimensional geometries can include shapes or portions thereof that are geometric, linear, curved, curvilinear, unique, angled, or any combination thereof, in non-limiting examples. More specifically, it should be understood that a variety of geometries can result in distortions of the final model, and that a variety of compensations can be utilized to minimize or eliminate the distortions, based upon the particular geometry of the final model. For example, the compensated model can include any number of positive or negative print regions. The positive or negative print regions can be shaped as triangles, rectangles, squares, regular or irregular polygon, circles, ovals, or some combination therein, as well as three-dimensional versions thereof as applied to the three-dimensional final model.

Figure 5:
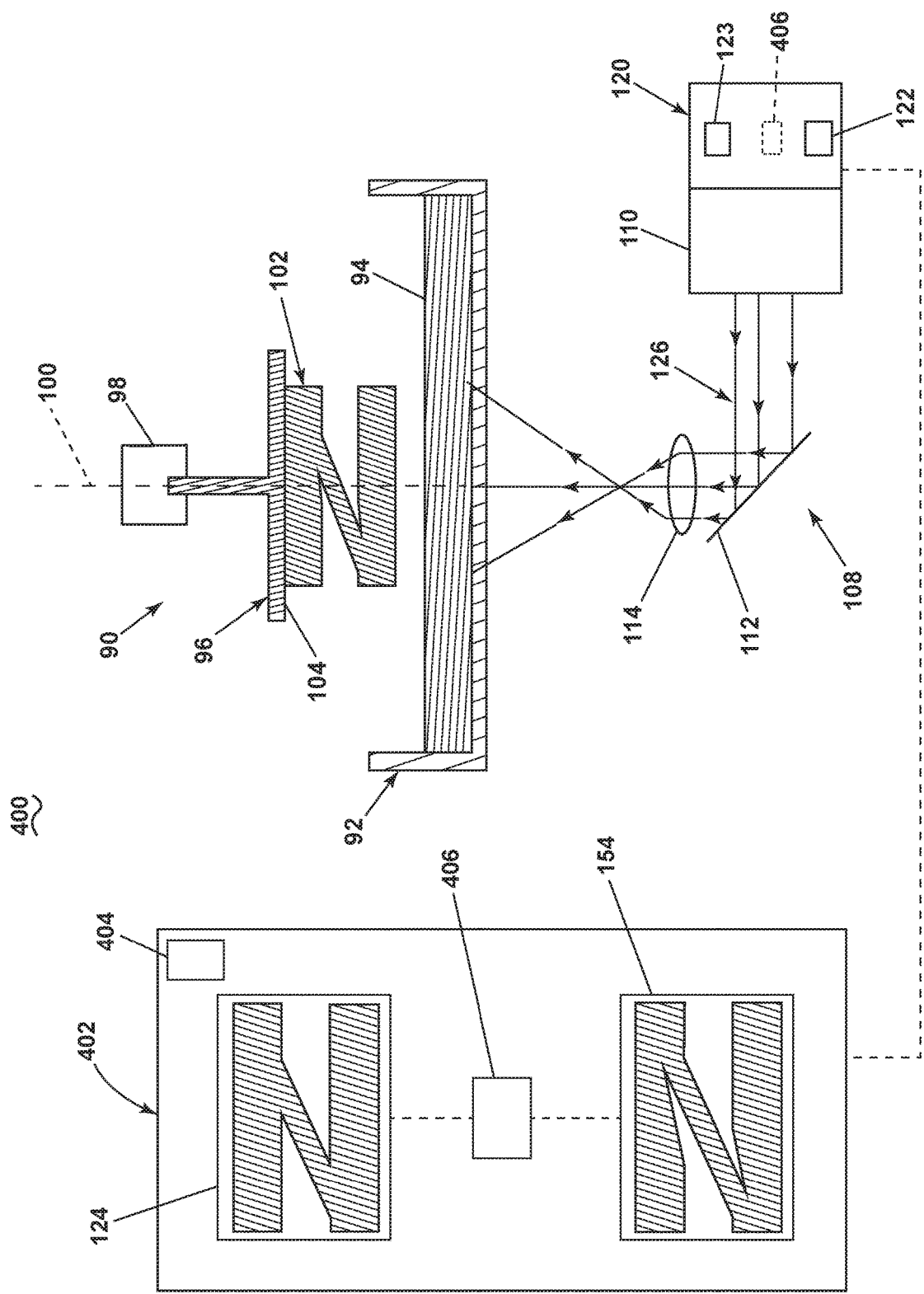
FIG. 5 is a schematic illustration of a system for compensating a final model to be a compensation model, and including an additive printer for forming the final model based upon the compensation model.

FIG. 5 illustrates a system 400 for forming or printing a component according to aspects of the present disclosure. The system 400 includes at least a source 402 in communication with a printer. It is contemplated that the source 402 can be any number of computers or communicating controllers capable of displaying, editing, transmitting, or creating the original model 124.

The printer can be any type of device or machine otherwise used to print or otherwise form components. By way of non-limiting example, the printer is illustrated as the DLP 3D printer 90 of FIG. 2. The source 402 can include a source memory 404 and a compensation module 406, such as a processor, that includes compensating software or other executables or computer instructions. Additionally, or alternatively, the compensation module 406 or a portion of the compensation module 406 can be included in the printer 90. That is, the source 402 can communicate the original model 124, the compensated model 154, or a partially compensated model to the printer 90. The original model 124 can be, by way of non-limiting example, a digitization of an actual part or a virtual model. It is further contemplated that the compensating software can be housed, installed, or loaded on the source 402 or the printer 90. That is, the compensating software can come with the source 402 or the printer 90 when purchased by a user or the compensating software can be installed or loaded on the source 402 or the printer 90 after the source 402 or printer 90 has been purchased by a user.

In operation, the source 402 of the system 400 generates or retrieves from the source memory 404 the original model 124. The original model 124 is then input into the compensation software of the compensation module 406. The compensation software can be used to automatically identify portions of the geometry that indicate a distortion may occur, or that a compensation is useful or will result in a more-accurate final model. For example, the compensation software can identify an acute angle, a sharp corner, an obtuse angle, a rounded region, or other geometries that would not immediately appear in the printed part or final model 102 as desired if printed from the original model 124. Alternatively, the identification of portions of the geometries of the original model 124 that could be compensated can be done, at least in part, manually.

Once identified, the compensating software modifies the identified distortions by compensating the original model 124 to become the compensated model 154, such that printing of the component or the final model 102 based upon the compensated model 154 is more alike the original model 124 than the compensated model 154. The compensated model 154 can be communicated to the controller 120 of the printer 90. Under direction from the controller 120, the component is then formed or printed by the printer 90 using the compensated model 154 to operate the printer 90, resulting in the final model 102 of the component. The component can be, by way of non-limiting example, at least a portion of an engine component for the turbine engine 10, or a print negative for encasing a portion of or an entire engine component for the turbine engine 10, such as for casting an engine component based upon the printed negative mold. The engine components or portions of engine components that can be formed from or casted by the final model 102 can include a blade, a vane, a strut, a service tube, a shroud, or a combustion liner in non-limiting examples, or any other engine component.

Alternatively, the original model 124 can be communicated to the controller 120 of the printer 90. Optionally, the controller 120 can include the compensation module 406 (or similar compensation software operable similar to that of the compensation module 406) for determining and generating the compensated model 154 before printing the component. Further, it is contemplated that the controller 120, the source 402, or any number of data processing devices can include portions of compensating software or the compensation module 406.

It is contemplated that compensating can further include adjusting a heat, light, speed, or other mechanical, electric, thermal, or magnetic property of the printer during the forming process, which can vary depending on the particular printer or method of printing or forming. These non-geometric compensations may not be immediately visible from the cross section of the compensated model 154, but can be included in the compensation model 154.

Figure 6:
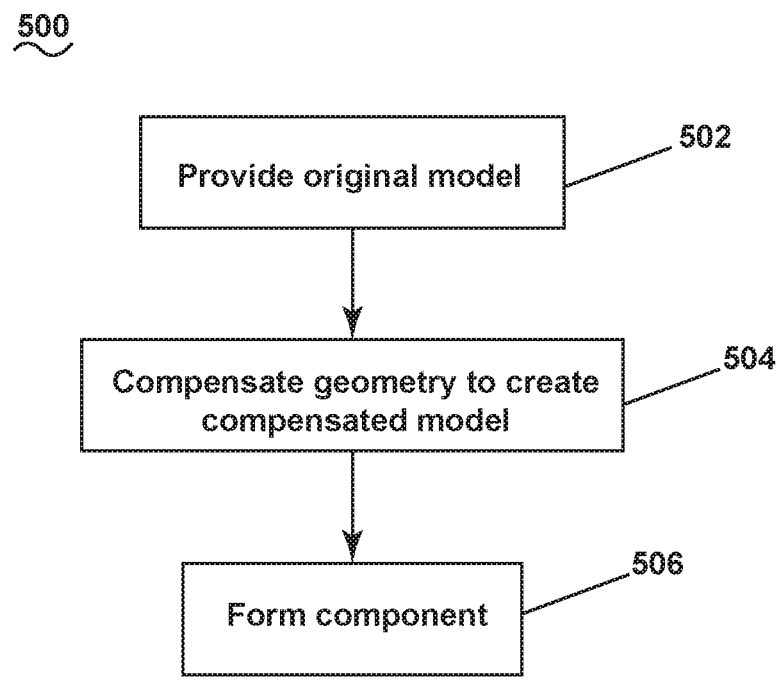
FIG. 6 is a flowchart illustrating a method forming a component, such as an engine component for the engine of FIG. 1, utilizing a compensation model.

FIG. 6 illustrates a method 500 of forming the component. At 502, the original model 124 of the component is provided. The original model 124 can be provided to the system 400 by an outside source or recalled and provided to the system 400 from the source memory 404. Outside sources can include a 3D scanner, computer or other electronic device capable of communicating, generating, or providing the original model 124, which can be virtual, to the system 400.

At 504, the geometry of the original model 124 is compensated to create the compensated model 154. Compensation of the geometry of the original model 124 can include identifying portions of the geometry of the original model 124 that can include an acute angle, a sharp corner, an obtuse angle, a rounded region, or other geometries resulting in or likely to result in a distortion. That is, the compensation software of the compensation module 406 can identify any geometries of the original model 124 that would appear varied or in some way distorted in the printed part or final model 102 if printed from the original model 124. That is, the compensation software reviews the geometry of the original model 124 for geometries that will be significantly distorted during forming or printing. Compensation to the geometry are made based on the knowledge or understanding of how the printer 90 can distort select geometries of the original model 124 during forming or printing. It should be noted that the particular printer or method of printing may vary the distortions relative to other printers or methods, and therefore, it is contemplated that the type of printer used, as well as other information such as material, temperatures, speed, or otherwise can be provided during compensation to be considered when developing the compensated model 154.

By way of non-limiting example, for the first acute angle 130*a*, material is removed from the first wall 140 forming the first acute angle 130*a*. The material removed can be the first negative print region 156 determined, in part, by knowing that curing or forming material at such an angle would normally result in curved portions 128 without compensation due to distortions during curing or forming.

At 506, the component is formed based upon the compensated model 154 such that the final model 102 of the component is more alike the original model 124 than the compensated model 154 by minimizing, reducing, or eliminating distortions during forming of the component. By way of non-limiting example, the printer 90 forms the component using DLP. While illustrated the printer 90 is illustrated as a DLP printer, it is contemplated that the printer 90 can be any 3-D additive manufacturing printer. It is further considered that the printer 90 can be used in photopolymerization based additive manufacturing. Photopolymerization based additive manufacturing is a process by which the final model 102 is formed in a layer by layer fashion using photochemical processes by which light causes chemical monomers to link together to form polymers. Non-limiting examples of related technologies that can be used for photopolymerization based additive manufacturing include, but are not limited to continuous liquid interface production (CLIP), daylight polymer printing (DPP), digital light processing (DLP), or stereolithography (SL).

The printer 90 can include compensating by modifying the intensity of a light source used in DLP. The compensated model 154 can also include compensating information that modifies the intensity of the light source 110 used in the printer 90. The intensity of the light source 110 can be modified discretely at areas of the original model 124, such as, for example in the regions at the first acute angle 164.

Optionally, the method 500 can further include testing the formation of the final model 102 based on the compensated model 154 to determine if the final model 102 will be more alike the original model 124 than the compensated model 154. The testing can be done virtually, for example, by a three-dimensional scanner measuring the final model 102, or by virtually generating the final model 102 based upon the compensated model 154 and utilizing the compensation software to determine what the modified final model 102 will be. The scanner, printer 90, or source 402 can compare the tested final model 102 to the original model 124 and update the compensated model 154 based upon the testing of formation from the final model 102 formed based the compensation model 154. That is, the final model 102 is tested via measuring, scanning, or otherwise compared to the original model 124 and the compensation software of the compensation module 406 is then updated based on the comparison.

Figure 7:
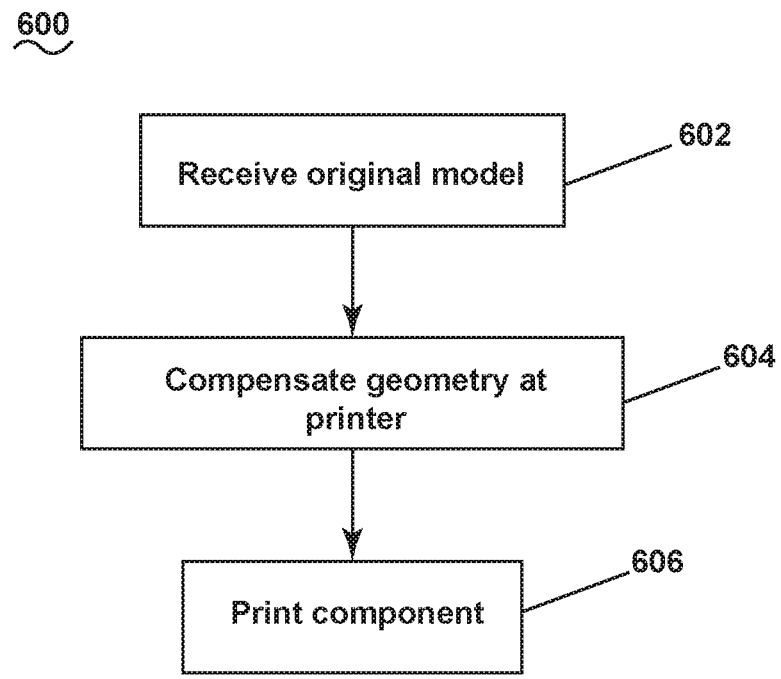
FIG. 7 is another flowchart illustrating a method of printing a component, such as an engine component for the engine of FIG. 1, utilizing a compensation model.

FIG. 7 illustrates a method 600 of printing the component. At 602, the original model 124 of the component is received at the printer 90. By way of non-limiting example, the controller 120 can receive the original model 124 or retrieve the original model 124 from the memory 122 of the printer 90. The original model 124 can be provided to the compensation module 406 that can be in communication or contained within the printer 90.

At 604, the geometry of the original model 124 is then compensated at the printer 90 to create the compensated model 154. The compensating can be done by a software program that is on the printer 90 or loaded on the printer 90, for example. By way of non-limiting example, using the compensation software used to create the compensated model 154 can be the compensation software included in the compensation module 406, where the compensation module 406 is housed in or loaded onto the controller 120 of the printer 90.

At 606, the printer 90 prints the component based upon the compensated model 154 such that the printed component, identified by way of non-limiting example as the final model 102, is more alike the original model 124 than the compensated model 154 due to distortions of the printer 90 during printing.

Optionally, the method 600 can further include at least one test printing of the compensated model 154. Test printing can include printing the component based on the compensated model 154 and determining if the printed component will be more alike the original model 124 then the compensated model 154. It is further contemplated that the method 600 can optionally include modifying the compensated model 154 based upon the test printing, in order to further minimize or eliminate distortions. Additionally, it is contemplated that such test printing can be saved or stored in a system memory, and can be used to update the compensation software based upon the returned test printing data.

The determination can include a three-dimensional scanner or other device or system that can obtain a virtual image of the final model 102, that is, the physically printed component. The compensation module 406 or other process or software contained in the printer 90 or the source 402 can compare the virtual image of the final model 102 to virtual image of the original model 124 and the virtual image of the compensated model 154. The compensation module 406 or other process or software can compare angles, lengths, depths, contour, or any other aspect of the virtual image of the final model 102 to the corresponding portions of the virtual image of the original model 124 and the virtual image of the compensated model 154. Alternatively, the determination of alike can be done through manual measurement.

If the formation of the final model 102 based on the compensated model 154 is determined to be more alike the compensated model 154 than the original model 124, modifications to the compensated model 154 are made based on the alikeness.

It is contemplated that the determining of alike can include pre-determined tolerances for differences in measurement of the angles, lengths, depths, contour, or any other aspect of the virtual image of the final model 102 and the corresponding portions of the virtual image of the original model 124. By way of non-limiting example, if the percent difference between the first acute angle 130a of the original model 124 and the first acute angle 180 of the final model 102 is greater than 5%, modifications to the compensated model 154 are made.

Benefits of aspects of the disclosure can improve the precision of the final printed/formed component from any 3D printer or forming device where the original model includes geometries distorted during the printing/forming process.

Another benefit of using the compensated model is that it allows for parts to be printed/formed that traditionally are not printed/formed due to their geometries.

Yet another benefit of using the compensated model is to produce final geometry that has sharp, detailed features at acute angles that would otherwise be rounded. By way of non-limiting example, the sharp, detailed features can help functionality of the final component for heat transfer augmentation, stress concentration management, or assembly with an adjacent turbine engine component.

While the inventive subject matter has been described with regard to the forming/printing of a component for a turbine engine blade, the inventive subject matter can be used with any device used to form or print molds, parts, models, or other components for a variety of machines or devices. The inventive subject matter is not limited to the specific aspects described and illustrated herein. Different aspects and adaptations besides those shown herein and described, as well as many variations, modifications and equivalent arrangements will now be apparent or will be reasonably suggested by the foregoing specification and drawings, without departing from the substance or scope of the inventive subject matter.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

1. A method of forming a component, the method including providing an original model of the component, compensating a geometry of the original model to create a compensated model, and forming the component based upon the compensated model such that a final model of the component is more alike the original model than the compensated model due to distortions during forming of the component.

2. The method of clause 1 wherein the original model is a virtual model.

3. The method of any preceding clause further comprising identifying an acute angle in the geometry of the original model, and wherein the compensating includes removing a portion of the original model at the acute angle.

4. The method of any proceeding clause wherein removing the portion of the original model includes removing a portion of a wall that partially forms the acute angle.

5. The method of any proceeding clause further comprising testing formation of the compensated model to determine if the final model will be more alike the original model than the compensated model.

6. The method of any proceeding clause wherein testing is done virtually.

7. The method of any proceeding clause further comprising updating the compensated model based upon the testing of formation of the compensated model.

8. The method of any proceeding clause wherein the compensating is performed at the same device that forms the component.

9. The method of any proceeding clause wherein the component is an engine component.

10. The method of any proceeding clause wherein the component is a print negative for casting an engine component.

11. The method of any proceeding clause wherein forming the component includes forming with photopolymerization based additive manufacturing.

12. The method of any proceeding clause wherein compensating includes modifying the intensity of a light source used in the photopolymerization based additive manufacturing.

13. A component made by the method of any proceeding clause.

14. A method of printing a component that includes receiving an original model of the component at a printer, compensating a geometry of the original model at the printer to create a compensated model, printing, with the printer, the component based upon the compensated model such that the printed component is more alike the original model than the compensated model due to distortions of the printer during printing.

15. The method of any preceding clause wherein the compensating is done by a compensating software.

16. The method of any preceding clause wherein the compensating software is housed, installed, or loaded on the source or the printer.

17. The method of any preceding clause further comprising at least one test printing of the compensated model to determine if the printed component will be more alike the original model than the compensated model and updating the compensated model based upon the tested printing.

18. A system for forming a component, the system including a source storing or generating an original model of the component, a printer, in communication with the source, for printing the component based upon the original model received from the source, wherein the source or the printer includes compensating software where the compensating software analyzes the original model and compensates the original model to become a compensated model such that printing of the component based upon the compensated model is more alike the original model than the compensated model.

19. The system of any preceding clause wherein the compensating software is configured to identify at least one acute angle formed in the original model of the component and remove a portion of the original model at the acute angle in the compensated model.

20. The system of any preceding clause wherein the printer or a scanner can be used to test a printed component that was printed based upon the compensated model, and update the compensated model based upon the testing of the printed component.

What is claimed is:

1. A method of forming a component from an original model, the method comprising:
   identifying an acute angle defined by a gap between a first surface and a second surface of the original model, wherein the original model is a virtual model;
   compensating the original model to create a compensated model, wherein the compensating includes removing a portion of the original model from one or more of the first surface or the second surface at the acute angle to form a compensated angle, wherein the compensated angle is included in the compensated model, the compensated model comprising:
      a first negative print region at the first surface, wherein the first negative print region is defined by at least a first inset wall and a second inset wall of the first surface, wherein an intersection of the first inset wall and the second inset wall of the first surface defines a non-zero angle spaced from the compensated angle, and wherein the compensated angle is defined by a portion of the first inset wall of the first surface; or
      a second negative print region at the second surface, wherein the second negative print region includes at least a first inset wall and a second inset wall of the second surface, wherein an intersection of the first inset wall and the second inset wall of the second surface defines a non-zero angle spaced from the compensated angle, and wherein the compensated angle is defined by a portion of the first inset wall of the second surface; and
   forming the component, after creating the compensated model, by additive manufacturing, the component based upon the compensated model such that a final model of the component, having a final angle, is more alike the original model than the compensated model due to distortions during forming of the component.

2. The method of claim 1 further comprising testing formation of the compensated model to determine if the final model will be more alike the original model than the compensated model.

3. The method of claim 2 wherein testing is done virtually.

4. The method of claim 2 further comprising updating the compensated model based upon the testing of the formation of the compensated model.

5. The method of claim 1 wherein the component is an engine component.

6. The method of claim 1 wherein the component is a print negative for casting an engine component.

7. The method of claim 1 wherein forming the component includes forming with photopolymerization based additive manufacturing.

8. The method of claim 7 wherein compensating further comprises modifying an intensity of a light source used in the photopolymerization based additive manufacturing.

9. The method of claim 1 wherein the final acute angle is more alike the acute angle than the compensated angle.

10. The method of claim 1 wherein the first negative print region or the second negative print region is the combination of a triangle and a quadrilateral or a second triangle.

11. A method of printing a component comprising:
   receiving an original model of the component at a printer, wherein the original model is an original virtual model;
   identifying an acute angle defined by a gap between a first surface and a second surface of the original virtual model;
   compensating the original virtual model at the printer to create a compensated model, wherein the compensating includes removing a portion of the original model from one or more of the first surface or the second surface at the acute angle to form a compensated acute angle, wherein the compensated acute angle includes a first negative print region or a second negative print region that is a combination of a triangle and a quadrilateral or a second triangle; and
   printing, after creating the compensated model from the original virtual model, with the printer, the component based upon the compensated model such that the printed component, having a printed acute angle, is more alike the original virtual model than the compensated model due to distortions of the printer during printing.

12. The method of claim 11 wherein the compensating is done by a compensating software.

13. The method of claim 12 wherein the compensating software is housed, installed, or loaded on the printer.

14. The method of claim 11 wherein the removing the portion of the original model includes removing a portion of a wall that partially forms the acute angle.

15. The method of claim 11 wherein the printed acute angle is more alike the acute angle than the compensated acute angle.

16. A system for forming a component, the system comprising: a source storing or generating an original model of the component, wherein the original model is an original virtual model; and a printer, in communication with the source, for printing the component based upon the original virtual model received from the source; wherein the source or the printer includes compensating software where, prior to printing, the compensating software analyzes the original virtual model to identify at least one acute angle defined by a gap between a first surface and a second surface of the original virtual model of the component and compensates the original virtual model by removing a portion of one or more of the first surface or the second surface at the at least one acute angle to become a compensated model, the compensated model comprising: a first negative print region at the first surface, wherein the first negative print region is defined by at least a first inset wall and a second inset wall of the first surface, wherein an intersection of the first inset wall and the second inset wall of the first surface defines a non-zero angle spaced from a compensated angle, and wherein the compensated angle is defined by a portion of the first inset wall of the first surface; or a second negative print region at the second surface, wherein the second negative print region includes at least a first inset wall and a second inset wall of the second surface, wherein an intersection of the first inset wall and the second inset wall of the second surface defines a non-zero angle spaced from a compensated angle, and wherein the compensated angle is defined by a portion of the first inset wall of the second surface; and wherein the printing of the compensated model by the printer provides a printed component, wherein the printed component, having a printed acute angle, is more alike the original virtual model than the compensated model.

17. The system of claim 16 wherein the printer or a scanner can be used to test the printed component that was printed based upon the compensated model, and update the compensated model based upon the testing of the printed component.

18. The system of claim 16 wherein the removed portion of the one or more of the first surface or the second surface of the original model defines a compensated angle in the compensated model, where the printed acute angle is more alike the acute angle than the compensated angle.

19. The system of claim 16 wherein the first negative print region or the second negative print region is the combination of a triangle and a quadrilateral or a second triangle.

* * * * *

UNITED STATES PATENT AND TRADEMARK OFFICE
CERTIFICATE OF CORRECTION

| | | |
|---|---|---|
| PATENT NO. | : 11,782,416 B2 | |
| APPLICATION NO. | : 16/871186 | |
| DATED | : October 10, 2023 | |
| INVENTOR(S) | : Daniel Endecott Osgood et al. | |

It is certified that error appears in the above-identified patent and that said Letters Patent is hereby corrected as shown below:

In the Claims

Column 18, Claim 1, Line 13, Insert --acute-- after "final"

Signed and Sealed this
Nineteenth Day of November, 2024

*Katherine Kelly Vidal*

Katherine Kelly Vidal
*Director of the United States Patent and Trademark Office*